United States Patent [19]

Nishiura et al.

[11] Patent Number: 4,634,883

[45] Date of Patent: Jan. 6, 1987

[54] IMAGE SENSOR COMPRISING A PLURALITY OF PHOTOSENSORS AND SWITCHES

[75] Inventors: Masaharu Nishiura; Masakazu Ueno, both of Kanagawa, Japan

[73] Assignee: Fuji Electric Company Ltd., Kanagawa, Japan

[21] Appl. No.: 699,432

[22] Filed: Feb. 7, 1985

[30] Foreign Application Priority Data

Feb. 9, 1984 [JP] Japan ................................ 59-23531
Feb. 9, 1984 [JP] Japan ................................ 59-23532

[51] Int. Cl.⁴ ............................................. H01J 40/14
[52] U.S. Cl. ..................................... 250/578; 358/213
[58] Field of Search ............................ 250/578, 209; 357/30–32, 24 LR; 358/212, 213, 293, 294

[56] References Cited

U.S. PATENT DOCUMENTS 4,479,062 10/1984 Kawasaki et al. .................. 250/578

Primary Examiner—Edward P. Westin
Attorney, Agent, or Firm—Finnegan, Henderson, Farabow, Garrett & Dunner

[57] ABSTRACT

An image sensor for use in a solid-state facsimile transmitter includes a plurality of photosensors disposed in an array, each photosensor composed of a plurality of series-connected photodiodes; a voltage source; a plurality of switches for selectively applying a reverse bias from the voltage source to the photosensor array, each photosensor in the array being successively reverse biased by a corresponding one of the switches; and an output resistor for detecting current flowing through the selected reverse biased photosensor. The photosensors and switches may each comprise a plurality of series-connected photodiodes provided on a common substrate.

7 Claims, 12 Drawing Figures

IMAGE SENSOR COMPRISING A PLURALITY OF PHOTOSENSORS AND SWITCHES

BACKGROUND OF THE INVENTION

This invention relates to an image sensor which comprises a large number of photosensors arranged to form an array.

Various solid-state facsimile transmitters have recently been developed in which image sensors, e.g., MOS or CCD elements fabricated by IC techniques, cooperate with lenses to achieve high speed operation and high reliability. In conventional solid state facsimile transmitters, images of manuscripts to be transmitted are reduced in size by lenses for focusing them onto the image sensor, however, thereby creating a deficiency in that the internal paths of light effectively become longer which causes the transmitters to be larger. Additionally, high accuracy is required in such arrangements of lenses and sensors.

To eliminate these deficiencies, a contact type image sensor as shown in FIG. 1 has been developed. In the photosensor array of FIG. 1, light emitted from an array of light emitting diodes 1 is reflected by a manuscript 2 and transmitted through a rod lens 3 to an array of amorphous silicon 5 (hereinafter referred to as "a-Si") formed on a base plate 4. The array of light emitting diodes (LEDs) 1 emits green light to which a-Si has high sensitivity. The manuscript 2 and a-Si sensor 5, which coact by placing rod lens 3 between them, are of the same size. Since the device requires no focusing lens, the distance between sensor 5 and manuscript 2 is reduced to less than 10 millimeters, as compared with the 600 millimeter spacing which was the case in the conventional device described previously. This provides a small image sensor for facsimile purposes.

Various materials, such as glass or ceramic, may be used as base plate 4, and a-Si sensor 5 is formed by glow discharge deposition from gassy silan. The deposited a-Si layer is patterned by using conventional photo etching techniques to form eight to sixteen photosensors per millimeter. Other integrated circuits may be formed on the same base plate 4 and connected to the a-Si photosensors.

FIG. 2 shows an equivalent electrical circuit diagram of the a-Si image sensor of FIG. 1. In the circuit, one thousand seven hundred twenty eight (1728) pairs of elements, each pair consisting of a photosensor 6 and a blocking diode 7, are connected in series to form a sensor array for reading manuscripts of conventional A4 size. The pairs are divided into thirty two (32) blocks of fifty four (54) pairs each. One terminal of each photosensor 6 is connected to a cathode of a corresponding blocking diode 7, respectively, and the other terminal of all fifty four photosensors in each block are connected together and to a respective switch 8. The corresponding anodes of the fifty four blocking diodes in each block are connected to a respective one of fifty four common leads which are, in turn, connected to one of fifty four switches 9, respectively. All the common leads are connected together through switches 9 to a positive terminal of a voltage source 11 via an output resistor 10. In the circuit of FIG. 2, threfore, the 1728 photosensors 6 are consecutively scanned by sequentially operating driving switches 8 and 9 to provide an output signal between output terminals 12 and 13.

A cross-sectional view of the photosensors of FIG. 1 is shown in FIG. 3. Each photosensor comprises a glass base plate 14, a metal electrode 15 composed of two layers of Pt and Ni, and a transparent electrode 16 of ITO, $SnO_2$, etc. Each electrode 15, 16 is formed on the base plate 14; an a-Si layer 17 is formed on electrodes 15 and 16; and a metal electrode 18 of Al or the like is formed on a-Si layer 17. A metal electrode 19 provided on glass base plate 14 is connected to transparent electrode 16.

The a-Si layer 17 comprises an i-layer 20 about 1 $\mu$m thick, and an n-layer 21 about 500 Å thick, as shown in FIG. 4. Electrode 16, a-Si layer 17 and upper electrode 18 together form a photosensitive portion. Electrode 19 connected to transparent electrode 16 is employed as a lead for connecting the photosensor to switch 8, as schematically depcited in FIG. 2. Metal electrode 15 is connected to switch 9 together with the corresponding electrodes of the other blocks. The arrow marked as reference character 22 depicts the direction from which light strikes and ultimately passes comes through glass base plate 14. A blocking diode is formed at the region where a-Si layer 17 is sandwiched by metal electrodes 15 and 18. Since the incident light 22 is reflected by the metal electrode 15 and does not reach the junction of the diode, the blocking diode operates as an ordinary diode, i.e., non-photosensitive. The junction of the blocking diode is formed at that portion where the Pt layer of electrode 15 contacts the i-layer 20 of a-Si layer 17, thus comprising a Schottky barrier junction.

Photosensor 6 is reverse biased in the absence of incident light. Light striking any of the photosensors is thus detected by selecting the respective sensor by driving switches 8 and 9. For example, when switches 81 and 91 located at the left hand side in FIG. 2 are closed, current from voltage source 11 flows through photosensor 61 at a magnitude dependent upon the amount of light coming into photosensor 61. The voltage drop across resistor 10 through which this current flows is thus read out as an output signal.

In the conventional device mentioned above, the following problems arise when any one of blocking diodes 7 is defective. If the defect is a short circuit between electrodes 16 and 18 in any of the blocking diodes, the corresponding sensor is always rendered conductive regardless of the existence of incident light; when scanned, such a sensor will always generate an output signal indicative of a "bright", i.e. illuminated, condition. Alternatively, if either of electrodes 16 and 18 is defective in its intended contact with a-Si layer 17, the signal read out when scanned will always be indicative of a "dark" condition. In the case of a short circuit existing in one of blocking diodes 7 such that the reverse current is not sufficiently blocked, the current from the corresponding photosensor is unimpeded and flows through output resistor 10 to disturb the current levels of the other photosensors. If any one of these defects exists, photosensor 5 as a whole is rendered defective so that the manufacturing yield of such contact-type photoreading devices decreases.

The conventional device has a further undesirable aspect. Although photosensors 6 and blocking diodes 7 are integrally formed with each other, as shown in FIG. 3, switches 8 and 9 are formed separately from the photosensor and blocking diodes. This separate formation adds to manufacturing costs and effort, as well as increasing the number of sites prone to failure during machine operation.

SUMMARY OF THE INVENTION

Accordingly, it is an object of the present invention to provide a contact type image sensor which can be fabricated at a higher yield despite the existence of some internal defects.

Another object of the present invention is to provide a contact type image sensor in which switches for scanning the photosensors are integrally formed with the sensors.

The objects mentioned above are achieved by an image sensor according to the present invention which comprises a plurality of photosensors disposed in an array, each of the photosensors being composed of a plurality of photodiodes connected in series; a voltage source; a plurality of switches for selectively applying a reverse bias from the voltage source to the plurality of photosensors, each photosensor in the array being successively reverse biased by operation of a corresponding one of the switches; and an output resistor for detecting current flowing through the selected reverse biased photosensor.

BRIEF DESCRIPTION OF THE DRAWINGS

Still other objects and features of the present invention will be apparent from the following description and accompanying drawings wherein.

DESCRIPTION OF THE PREFERRED EMBODIMENTS

Figure 5:
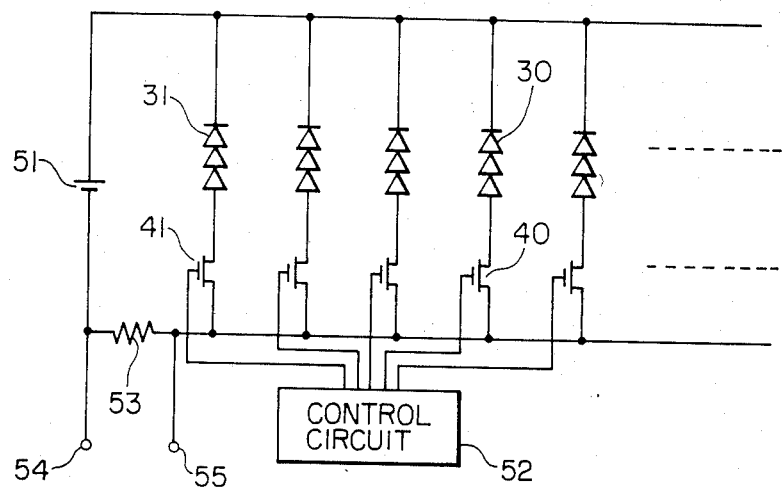
FIG. 5 is an equivalent electrical circuit diagram of an image sensor according to a preferred embodiment of the present invention.

An equivalent electrical circuit diagram of an image sensor according to a preferred embodiment of the present invention is shown in FIG. 5. In the circuit, each photosensor comprises three photodiodes 30 connected in series, with the anodes of the last diode in each photosensor being connected together through respective semiconductor switches 40 so as to be selectively connected to a negative terminal of the voltage source 51 through a resistor 53. Switches 40 are successively turned on by a control circuit 52 to select one of photosensors 30, and the current flowing through the selected photosensor 30 is read out as a voltage drop across terminals of 54 and 55 of output resistor 53. A control circuit 52 suitable for driving of switches 40 may comprise a pulse sequencer or the like, and is conventional in the art.

The magnitude of current flowing through output resistor 53 is substantially proportional to the amount of light which is detected by the selected photosensor. Therefore, the magnitude of the current reflects the brightness of that portion of a manuscript (not shown) which is positioned opposite to the selected photosensor. The photosensors are preferably arranged in an array defined by rows and columns of photosensors in a common plane, and are scanned by sequential operation of semiconductor switches 40 to operate cumulatively as an image sensor.

Figure 1:
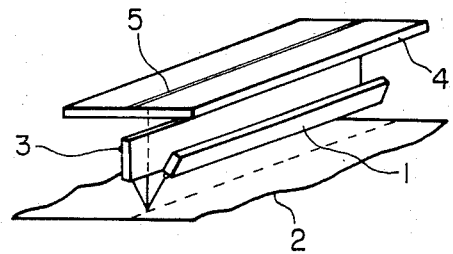
FIG. 1 is a perspective illustration of a conventional contact type image sensor.
Figure 2:
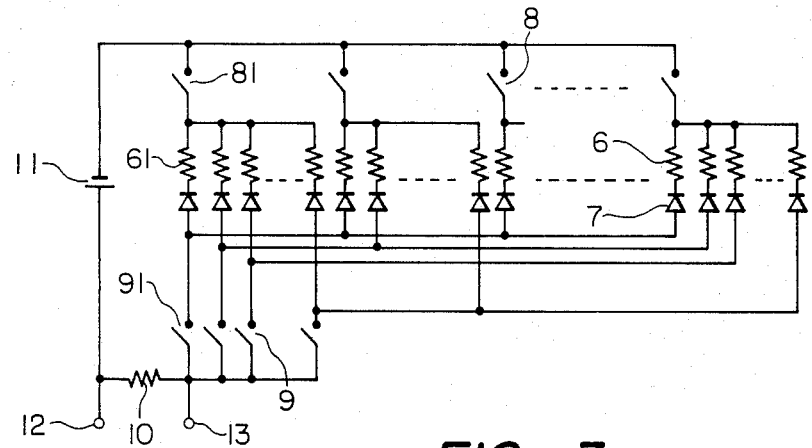
FIG. 2 is an equivalent electrical circuit diagram of the image sensor shown in FIG. 1.
Figure 3:
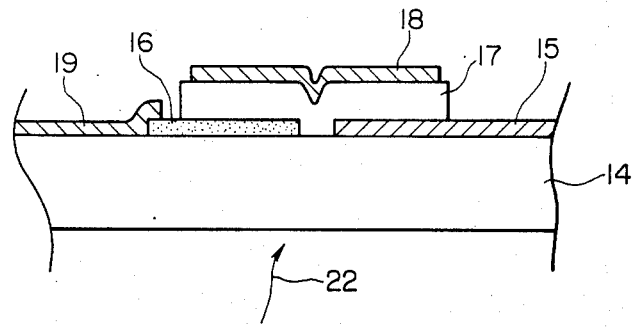
FIG. 3 is a cross-sectional view of a photosensor of the image sensor shown in FIGS. 1 and 2.
Figure 4:
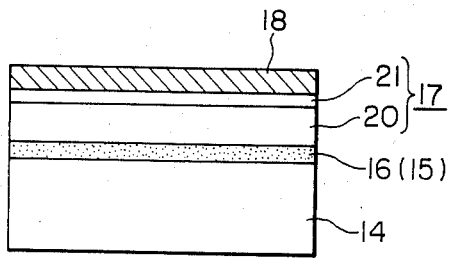
FIG. 4 is a cross-sectional view of an amorphous silicon layer of the photosensor shown in FIG. 3.
Figure 6:
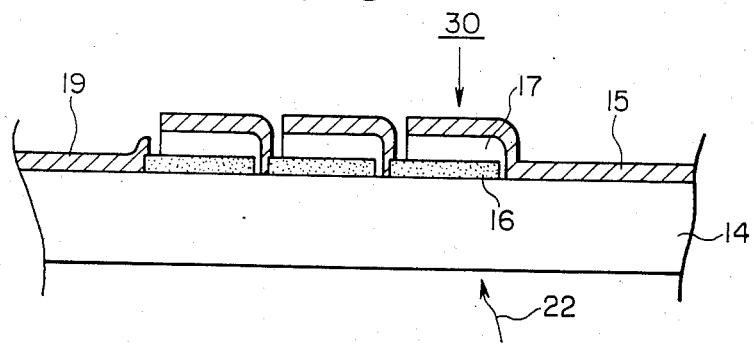
FIGS. 6 and 7 are cross-sectional views of a photosensor in FIG. 5.
Figure 7:
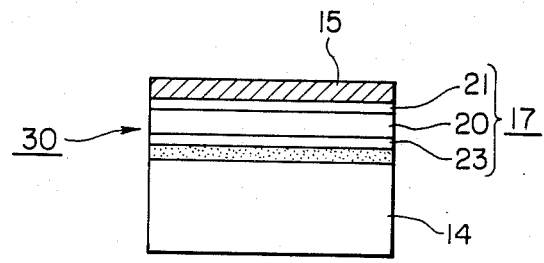

The construction of each of the series-connected photodiodes 30 is shown in FIGS. 6 and 7. In these figures, the same reference numerals are used for the same elements as in FIGS. 3 and 4. Three transparent electrodes 16 are formed on glass base plate 14, and a plurality of layers of a-Si 17 are formed on each electrode 16. These a-Si layers 17 are formed of a p-layer 23 of thickness of about 100 Å, an i-layer 20 of thickness of about 0.5 µm, and an n-layer 21 of thickeness of about 500 Å, with each layer formed successively on top of another. Layers 23, 20 and 21 are preferably deposited from gassy silan by glow discharge. Boron is mixed into the silan when the p-layer is formed, and phosphine is mixed into the silan when the n-layer is formed. Metal electrodes 15 of Al or the like are formed on each of a-Si layers 17 and are connected to transparent electrodes 16 formed under the adjacent a-Si layers 17. In this manner, three photodiodes 30, each comprising one of the transparent electrodes 16, a-Si layers 17 and metal electrodes 15, respectively, are connected in series on a common base 14. The transparent electrode 16 at one end of the series-connected photodiodes, i.e., the photodiode at the left hand side in the case of FIG. 6 is connected to a metal electrode 19 of Al or other suitable conductive material.

In the circuit of FIG. 5, when one of switches 40 is closed, the voltage from source 51 is applied to the photodiode which is connected to the closed switch. For instance, when switch 41 at the left-hand side of the figure is closed, voltage is applied to photodiode 31 to reverse bias it.

Figure 8:
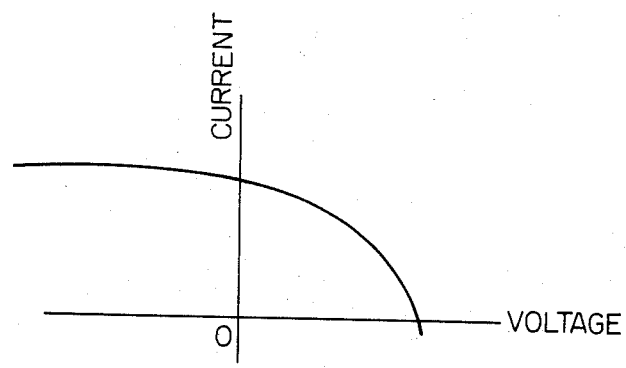
FIG. 8 is a graph illustrating the relation between voltage and current for the photodiode in FIGS. 5 to 7.

FIG. 8 graphically shows the relationship of voltage and current of diodes 30 in which the reverse-bias state is in the second quadrant. In this state, the current through the diodes does not change substantially with voltage. Therefore, since the magnitude of the photovoltaic current does not depend on the bias applied to the photodiodes 30, the current detected is the same regardless of the number of diodes connected in series, provided at least one of the series-connected diodes is operating properly. In other words, if one or even two of the three series connected diodes is faulty, the composite photodiode 30 will still provide the proper current level (indicative of light or dark conditions) provided at least one of the three individual diodes is still operating properly.

As a result, the manufacturing yield of the image sensor can be greatly increased. For example, the likelihood of a defective diode being present in a photosensor is usually less than 5 percent. Nevertheless, the yield of the image sensor will be zero if each of the 1728 photosensors includes only a single diode and some 86 of those single diodes are defective, under the foregoing assumption that the probability that each diode is defective is 5 percent. On the other hand, the yield of the image sensor will be 78 percent if each of the 1728 photosensors comprises three diodes connected in series under the same assumption, i.e. the image sensor is inoperative only if all three series connected diodes of a particular photosensor are defective. A yield of about 83 percent can be obtained for an image sensor having 1728 photosensors, each comprising two serially connected diodes, if the probability of defective diodes is decreased to one percent. In this manner, in the case of an image sensor which comprises photosensors of a single photodiode, the yield is zero unless all of the photodiodes have no defect. The yield is thus greatly increased by using photosensors comprising two or three photodiodes connected in series and by using an operating mode in which a reverse bias is applied to the photodiodes.

Figure 9:
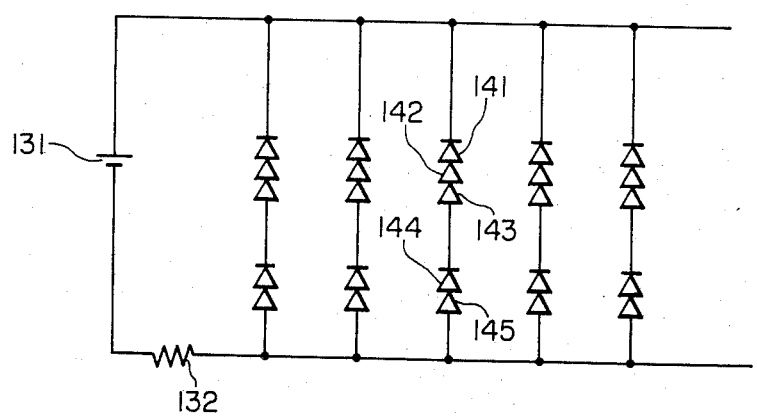
FIG. 9 is an equivalent electrical circuit diagram of an image sensor according to a second embodiment of the present invention.

FIG. 9 shows an equivalent circuit diagram of another preferred embodiment of the invention.

In the circuit of FIG. 9, many pairs of photodiodes, each comprising five series connected photodiodes, are connected to a voltage source 131 through an output resistor 132. In each pair, the three series connected photodiodes 141, 142 and 143 operate as a photosensor. That is, the three diodes are reversely biased and the magnitude of a current flowing through them is proportional to the amount of incident light. In this embodiment, the number of series-connected photodiodes is not necessarily three, but may instead be two or one. However, more than two diodes can greatly increase the yield of the image sensor, as detailed above.

The other two series-connected photodiodes 144 and 145 in each pair operate as a switch. The switch includes two photodiodes to increase the yield of the image sensor, but it can also operate via a single photodiode if yield is not a consideration.

Figure 10:
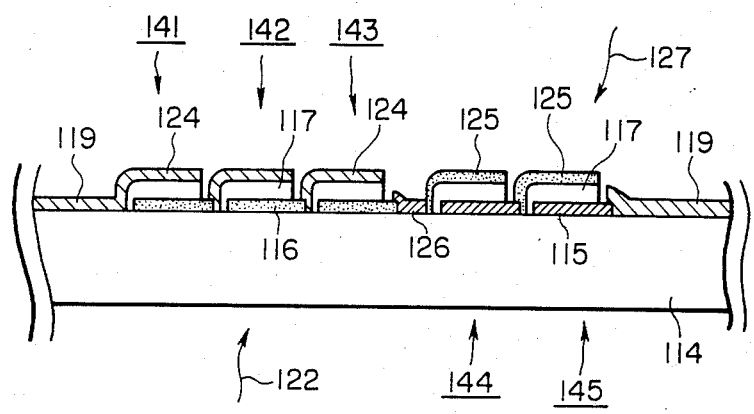
FIGS. 10 and 11 are cross-sectional views of a photosensor of the image sensor of FIG. 9 and a corresponding optical switch.
Figure 11:
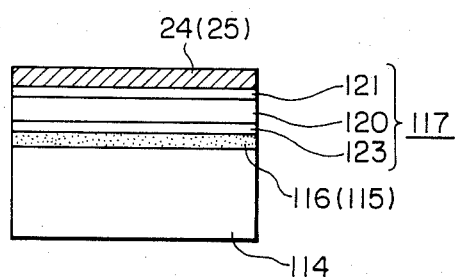

FIGS. 10 and 11 show cross-sectional views of a pair of five series connected photodiodes of the type schematically shown in FIG. 9. Three transparent electrodes 116 and two metal electrode 115 are formed on a glass base plate 114 so as to have rectangular shapes. The metal electrodes 115 are preferably composed of one layer of Ti, Ni, Cr, Mo, etc., or two layers of combinations of Ti/Ni, Ti/Al, etc.

An a-Si layer 117 is formed on each electrode. As shown in FIG. 11, each of the a-Si layers is composed of a p-layer 123 of thickness of about 100 Å, an i-layer 120 of thickness of about 0.5 $\mu$m, and an n-layer 121 of thickness of about 500 Å, with the p-i-n layers stacked on top of each other. Layers 123, 120 and 121 are deposited from gassy silan by glow discharge. Boron is mixed into the silan when the p-layer is formed, and phosphine is mixed into the silan when the n-layer is fored. The a-Si layers 117 are formed to have a slightly shifted lateral position relative to transparent electrodes 116 and metal electrodes 115, as shown best in FIG. 10, by using masks or other conventional photoetching techniques.

A patterned metal electrode 124 and transparent electrode 125 are formed on each of the a-Si layers 117. Each of metal electrodes 124 contacts the transparent electrode 116 under the adjacent a-Si layer 117, and each of transparent electrodes 125 contacts the metal electrode 115 under the adjacent a-Si layer so as to facilitate the desired series connections. The innermost electrodes of transparent electrodes 125 and 116 are connected by a connecting metal electrode 126 on base plate 114. The outermost electrodes of metal electrodes 115 and 124 are connected to connecting metal electrodes 119 on base plate 114, respectively. In this manner, three photodiodes 141, 142 amd 143, each comprising an a-Si layer 117, a transparent electrode 116 and a metal electrode 124, are connected in series overall. These three photodiodes operate as photosensors to be rendered conductive by incident light 122 coming through glass base plate 114.

The other two series-connected photodiodes 144 and 145 are not rendered conductive by the incident light 122, because the incident light 122 cannot pass through opaque metal electrodes 115. When photodiodes 144 and 145 are reversely biased, no photocurrent arises in the corresponding photosensor comprising photodiodes 141, 142 and 143 even if the incident light 122 exists. Photodiodes 144 and 145 are, however, rendered conductive by incident light 127 coming from a direction opposite to the incident light 122. In this manner, the photodiodes 144 and 145 operate as optically driven switches for scanning the photosensors.

Light 122 and 127 are preferably provided from opposite directions so that they do not interfere each other. However, both may be provided from the same direction, if they can be separated in an appropriate manner.

Figure 12:
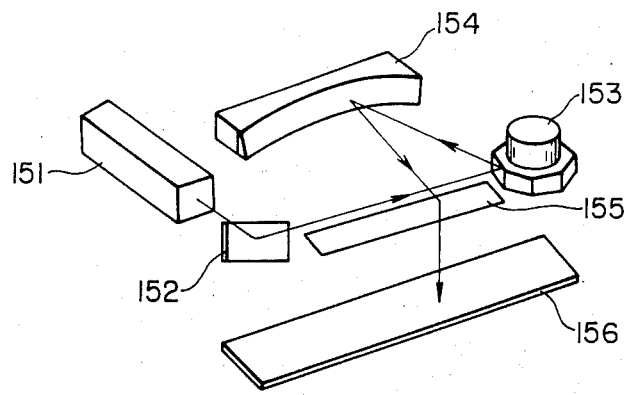
FIG. 12 is a perspective illustration of a scanning mechanism for operating the optical switches of the image sensor shown in FIGS. 9 through 11.

FIG. 12 shows an apparatus for controlling illumination for optically driving the two series-connected photodiodes.

A light emission source 151 is provided, consisting of a laser for emitting visual light, such as a He-Ne laser. The emitted light is scanned rapidly across image sensor 156 by the use of a reflector 152, a polygon scanner 153 having rotatable polygonal mirrors, a concave mirror 154 and reflector 155. The switching portions of image sensor 156, each comprising photodiodes 144 and 145, are successively illuminated by the laser beam, which has a radius of about several tens of microns, so as to be rendered selectively conductive. As a result, photocurrents, each having a magnitude depending upon the amount of light 126 illuminated on each of the photosensors, flow through output resistor 132. The resistance of each of the switching portions under illumination is preferably lower than that of the corresponding photosensor portions, thus rendering it appropriate to illuminate the former portions with a more intense laser beam than the light otherwise illuminating the latter portions. This difference in intensity helps to avoid unintentional operation of the switching photodiodes.

A difference of about 5 percent was observed in the magnitude of current flowing through output resistor 132 (FIG. 9) between the case in which three photodiodes 141-143 were all normal and the case in whch one of the three diodes was defective. The output voltage of voltage source 11 in this example was 5 volts.

The foregoing example, in which the a-Si layers forming the photodiodes 141-145 are composed of a p-i-n layer stacked on a glass base plate, is but one embodiment illustrating the invention and is not intended to restrict the scope of the present invention. For example, photodiodes formed of single crystal silicon may be used instead of photodiodes formed of thin film amorphous silicon. Thus, it is intended that all matter contained in the foregoing description or shown in the accompanying drawings shall be interpreted as illustrative and not in a limiting sense.

What is claimed is:

1. An image sensor comprising:

a plurality of photosensors disposed in an array, each of said photosensors being composed of a plurality of photodiodes connected in series;

a voltage source;

a plurality of switches for selectively applying a reverse bias from said voltage source to said plurality of photosensors, each photosensor in said array being successively reverse biased by operation of a corresponding one of said switches; and an output resistor for detecting current flowing through a reverse biased photosensor selected by one of said switches.

2. The image sensor according to claim 1, wherein said switches are optically driven switches integrally formed on a common substrate with said array of photosensors.

3. The image sensor according to claim 2, wherein said optically driven switches each comprises a plurality of photodiodes connected in series.

4. An image sensor comprising:

a plurality of photosensors disposed in an array, said photosensors being formed on a common substrate;

a voltage source;

a plurality of switches for selectively applying a reverse bias from said voltage source to said plurality of photosensors, each photosensor in said array being successively reverse biased by a corresponding one of said switches; and an output resistor for detecting current flowing through said selected reverse biased photosensor, said plurality of switches comprising optically driven switches integrally formed on said substrate with said array of photosensors.

5. The image sensor according to claim 4, wherein each of said photosensors comprises a plurality of photodiodes connected in series.

6. The image sensor according to claim 4 wherein said optically driven switches each comprises a plurality of photodiodes connected in series.

7. The image sensor according to claim 5, wherein said optically driven switches each comprises a plurality of photodiodes connected in series.

* * * * *